United States Patent
Chen

(10) Patent No.: US 9,172,562 B2
(45) Date of Patent: Oct. 27, 2015

(54) CALIBRATION CIRCUIT, INTEGRATED CIRCUIT HAVING CALIBRATION CIRCUIT, AND CALIBRATION METHOD

(75) Inventor: Wei Chih Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 579 days.

(21) Appl. No.: 13/525,981

(22) Filed: Jun. 18, 2012

(65) Prior Publication Data

US 2013/0335135 A1 Dec. 19, 2013

(51) Int. Cl.
*G01R 35/00* (2006.01)
*H04L 25/02* (2006.01)

(52) U.S. Cl.
CPC ........ *H04L 25/0272* (2013.01); *H04L 25/0278* (2013.01)

(58) Field of Classification Search
CPC .................. H03K 19/0005; H03K 19/018585; G11C 7/1057; G11C 2207/2254; G11C 7/1051; G11C 5/063; G11C 7/02; G11C 7/1078; G11C 7/1084; G11C 29/028; G11C 11/4093; H04L 25/0278; H04L 25/028; H04L 25/0298; H03H 7/38; G01R 31/31717

USPC ..................... 324/202, 601; 326/30; 702/107; 327/509; 365/189.11
See application file for complete search history.

(56) References Cited

U.S. PATENT DOCUMENTS

| | | | |
|---|---|---|---|
| 2005/0052200 A1* | 3/2005 | Nguyen et al. | 326/30 |
| 2007/0010961 A1* | 1/2007 | Nguyen et al. | 702/107 |
| 2010/0039095 A1* | 2/2010 | Ang et al. | 324/76.11 |
| 2012/0187978 A1* | 7/2012 | Fazeel et al. | 326/30 |

* cited by examiner

*Primary Examiner* — Melissa Koval
*Assistant Examiner* — Daniel Miller
(74) *Attorney, Agent, or Firm* — Hauptman Ham, LLP

(57) ABSTRACT

A calibration circuit for calibrating a device to be calibrated includes a variable current generator, a device under test and a control unit. The variable current generator is coupled to a first node of a reference voltage and configured to generate a variable current responsive to variations of the reference voltage. The device under test is a copy of at least one portion of the device to be calibrated, and coupled to the variable current generator to derive, at a second node, a voltage dependent on the variable current. The control unit is coupled to the second node to receive the derived voltage and configured to compare the derived voltage with the reference voltage and to generate, based on a comparison result, at least one calibration signal for adjusting an adjustable electrical parameter of the device under test and the device to be calibrated.

20 Claims, 8 Drawing Sheets

CALIBRATION CIRCUIT, INTEGRATED CIRCUIT HAVING CALIBRATION CIRCUIT, AND CALIBRATION METHOD

BACKGROUND

Various electronic devices are configured to operate under predetermined and/or optimal operating conditions. The operation of an electronic device is likely affected by a number of factors, such as temperature, operating voltage, etc., especially when the electronic device has complex circuitry and/or operates at high frequency. A calibration circuit is used to calibrate an electronic device and the output of the calibration circuit is used to bring the electronic device toward the predetermined and/or optimal operating conditions under which the electronic device operates as intended.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
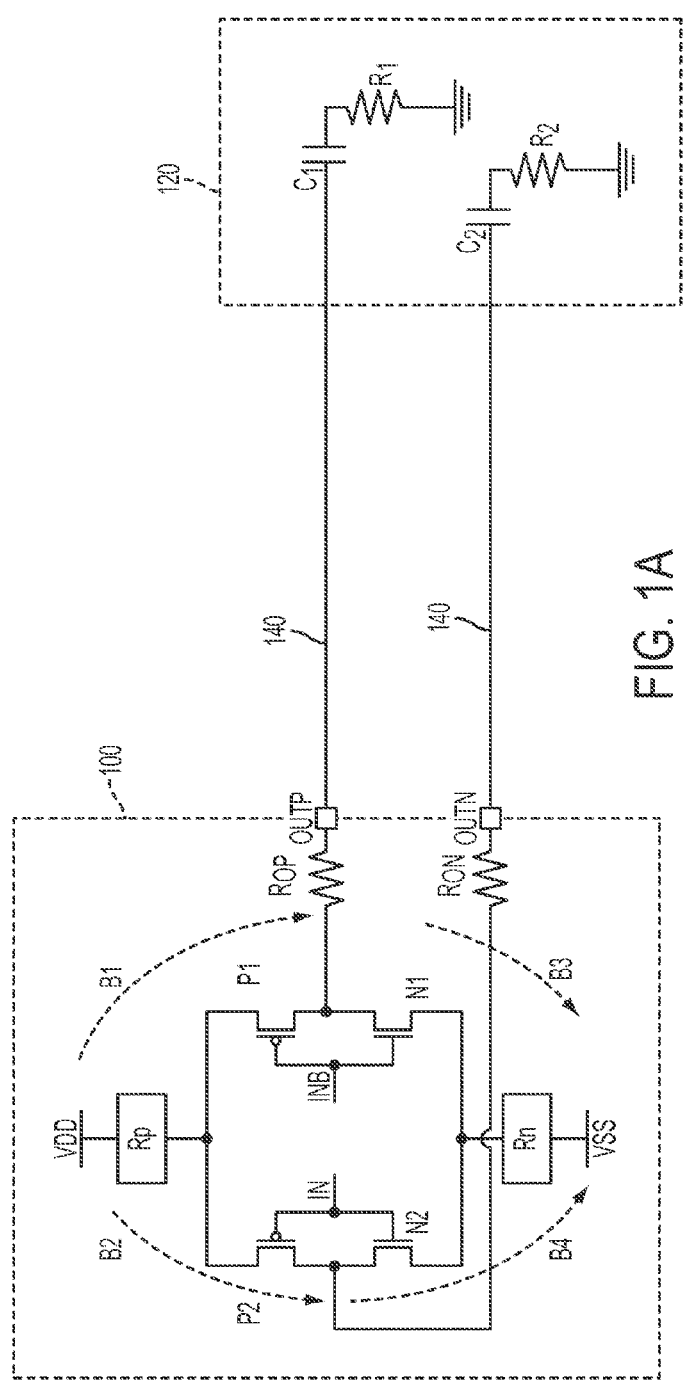
FIG. 1A is a schematic circuit diagram of a voltage mode driver in accordance with some embodiments.

It is to be understood that the following disclosure provides many different embodiments or examples, for implementing different features of various embodiments. Specific examples of components and arrangements are described below to simplify the present disclosure. The inventive concept may; however, be embodied in many different forms and should not be construed as being limited to the embodiments set forth herein. It will be apparent, however, that one or more embodiments may be practiced without these specific details. Like reference numerals in the drawings denote like elements.

In some embodiments, a calibration circuit generates a variable current in response to variation of a reference voltage and/or a power supply voltage supplied to a device to be calibrated. The calibration circuit uses the variable current for calibrating the device to be calibrated, thereby compensating for potential negative effects caused by the variation of the reference voltage and/or the power supply voltage. In one or more embodiments, process and/or temperature variations are also compensated for by the calibration circuit.

FIG. 1A is a schematic circuit diagram of a voltage mode driver 100 in accordance with some embodiments. The voltage mode driver 100 is configured as a transmitter and is coupled with a receiver 120 via a communication link 140. The voltage mode driver 100 comprises a first output terminal OUTP, a second output terminal OUTN, a first input terminal INB, a second input terminal IN, a first output resistor Rop coupled to the first output terminal OUTP, and a second output resistor Ron coupled to the second output terminal OUTN. The voltage mode driver 100 further comprises a first pull-up circuit P1, a first pull-down circuit N1, a second pull-up circuit P2 and a second pull-down circuit N2. The voltage mode driver 100 further comprises a pull-up resistor Rp and a pull-down resistor Rn.

In one or more embodiments, the power supply voltage VDD is about 1V, and the ground voltage VSS is zero. However, other supply voltage schemes are within the scope of various embodiments. In one or more embodiments, the first pull-up circuit P1 and second pull-up circuit P2 each comprise a p-channel metal-oxide semiconductor (PMOS) transistor, and the first pull-down circuit N1 and second pull-down circuit N2 each comprise an n-channel metal-oxide semiconductor (NMOS) transistor. However, other pull-up and/or pull-down circuits are within the scope of various embodiments.

In some embodiments, differential input signals are supplied to the first input terminal INB and the second input terminal IN, and differential output signals are outputted via the first output terminal OUTP and the second output terminal OUTN. The differential output signals are sent via the communication link 140 to the receiver 120. The receiver 120 comprises a first termination resistor R1 coupled to the first output terminal OUTP via a first capacitor C1, and a second termination resistor R2 coupled to the second output terminal OUTN via a second capacitor C2.

The resistance or impedance of the transmitter, i.e., the voltage mode driver 100, is matched to that of the receiver 120, to achieve one or more benefits, such as data integrity, reliability, high speed or low power consumption. For example, a total resistance or impedance of a first branch B1 including the pull-up resistor Rp, the first pull-up circuit P1 and the first output resistor Rop is matched to that of the first termination resistor R1. In some embodiments, impedance matching occurs when the resistance or impedance of the transmitter, i.e., the voltage mode driver 100, is within a tolerance of ±x % of the resistance or impedance of the receiver 120. The value of "x" depends on a particular application. For example, in one or more embodiments, x=5, i.e., the impedance matching occurs when the resistance or impedance of the transmitter, i.e., the voltage mode driver 100, is within ±5% of the resistance or impedance of the receiver 120. In one or more embodiments for more precise impedance matching, x=1, i.e., the impedance matching occurs when the resistance or impedance of the transmitter, i.e., the voltage mode driver 100, is within ±1% of the resistance or impedance of the receiver 120. Other values of "x" are within the scope of various embodiments.

In some embodiments, one or more of the pull-up resistor Rp, pull-down resistor Rn, first pull-up circuit P1, second pull-up circuit P2, first pull-down circuit N1, second pull-down circuit N2, first termination resistor R1, and second termination resistor R2 is/are calibrated for impedance matching purposes. For example, one or more of the first termination resistor R1 and second termination resistor R2 of the receiver 120 is/are calibrated toward a predetermined value, e.g., 50 Ohm. Similarly, one or more of the first through fourth branches B1-B4 of the voltage mode driver 100 is/are calibrated toward a predetermined value, e.g., 50 Ohm. Other predetermined resistance values are within the scope of various embodiments.

In some embodiments, the resistance of the first pull-up circuit P1 is configured to be small relative to the total resistance of the first branch B1. For example, the resistance of the first pull-up circuit P1 is, in one or more embodiments, about 1-5% of the total resistance of the first branch B1. Similarly, the resistance of one or more of the second pull-up circuit P2, the first pull-down circuit N1, and the second pull-down circuit N2 is configured to be small relative to the total resistance of the corresponding second branch B2, third branch B3, and fourth branch B4. Therefore, the resistance of one or more of the first pull-up circuit P1, the second pull-up circuit P2, the first pull-down circuit N1, and the second pull-down circuit N2 is negligible and is not calibrated. Thus, the calibration of the voltage mode driver 100 includes calibration of one or more of the pull-up resistor Rp and the pull-down resistor Rn. Other arrangements where the resistance of one or more of the first pull-up circuit P1, the second pull-up circuit P2, the first pull-down circuit N1, and the second pull-down circuit N2 is/are calibrated are within the scope of various embodiments. Further, electrical parameters other than resistance or impedance, such as inductance, capacitance, etc., are calibrated in various embodiments.

In some embodiments, one or more of the pull-up resistor Rp, the pull-down resistor Rn, the first termination resistor R1 and the second termination resistor R2 includes an array of a plurality of resistors connected together by one or more serial or parallel connections. At least one of the resistors is controllable to be connected to or disconnected from the resistor array, thereby varying a resistance of the resistor array.

Figure 1B:
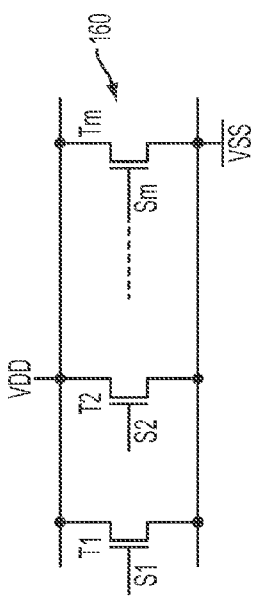
FIG. 1B is a schematic circuit diagram of a resistor array in accordance with some embodiments.

FIG. 1B is a schematic circuit diagram of a resistor array 160 in accordance with some embodiments. The resistor array 160 includes a plurality of MOS transistors T1, T2 ... Tm coupled in parallel. The MOS transistors T1, T2 ... Tm are individually controlled to be ON or OFF by corresponding switching signals S1, S2 ... Sm which are referred to herein as switching signals S(m). When a MOS transistor is ON, an ON resistance thereof contributes to the overall resistance of the resistor array 160. When a MOS transistor is OFF, the MOS transistor is considered disconnected from the resistor array 160 and does not contribute to the overall resistance of the resistor array 160. By variously switching ON or OFF one or more of the MOS transistors, the resistance of the resistor array 160 is varied. In one or more embodiments, the MOS transistors have the same or similar sizes and, therefore, the MOS transistors have the same or similar resistance (i.e., ON resistance). In one or more embodiments, the MOS transistors have different sizes and, therefore, the MOS transistors have different resistances. For example, a first MOS transistor has a resistance r, a second MOS transistor has a resistance 2 r, a third MOS transistor has a resistance 4 r, etc. A binary control arrangement is usable with the MOS transistors having resistances of r, 2 r, 4 r, etc. to vary the overall resistance of the resistor array 160. Other arrangements of MOS transistors in the resistor array 160 are within the scope of various embodiments.

In one or more embodiments, the pull-up resistor Rp comprises an array of PMOS transistors, and the pull-down resistor Rn comprises an array of NMOS transistors. The number and/or arrangement of PMOS transistors in the pull-up resistor Rp are not necessarily the same as the number and/or arrangement of NMOS transistors in the pull-down resistor Rn. In some embodiments, the resistance of one or more of the pull-up resistor Rp, the pull-down resistor Rn, the first termination resistor R1 and the second termination resistor R2 is calibrated to achieve impedance matching. The calibration operation is performed by a calibration circuit.

Figure 2A:
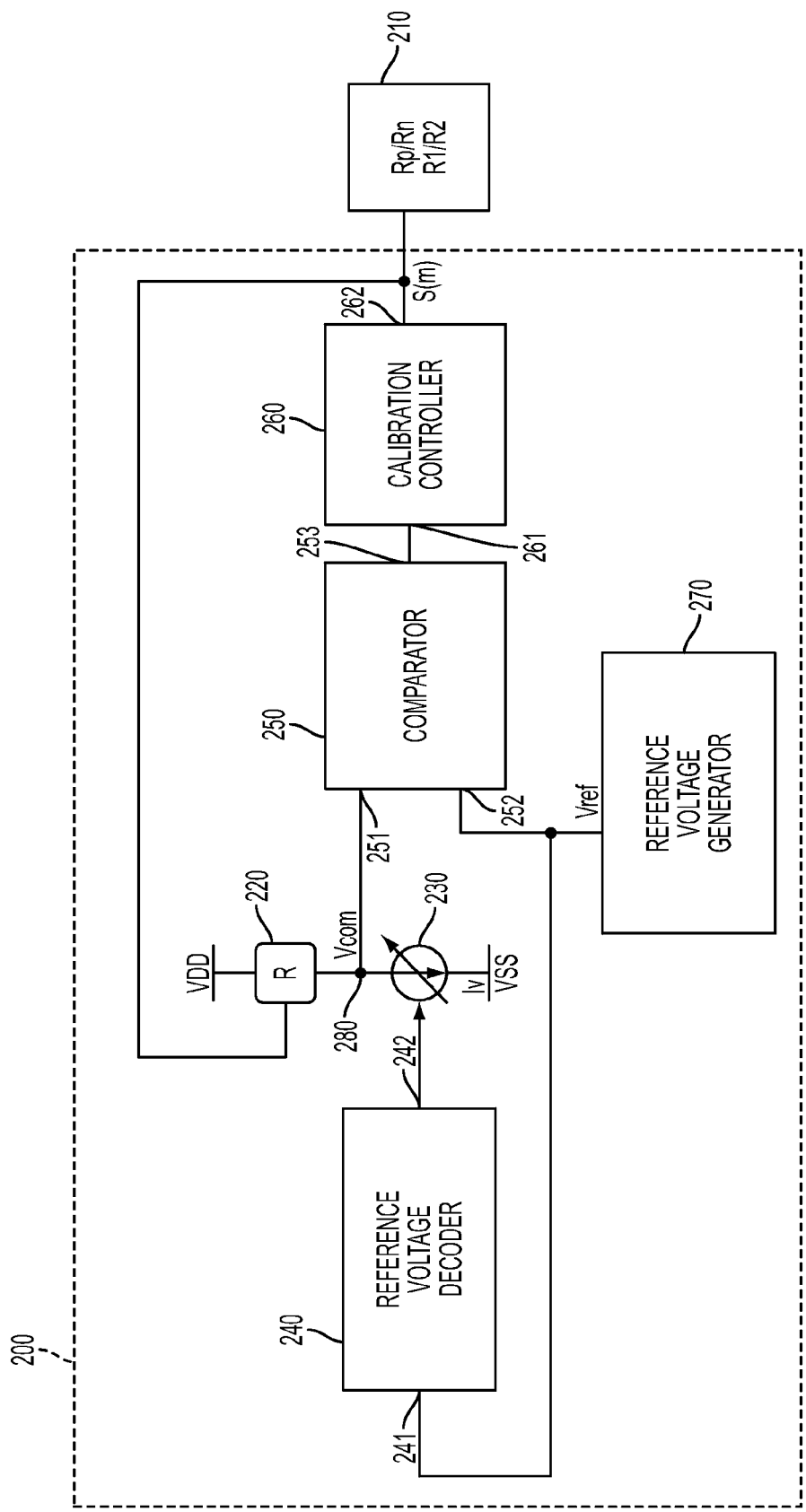
FIGS. 2A-2B are schematic circuit diagrams of various calibration circuits in accordance with some embodiments.

FIG. 2A is a schematic circuit diagram of a calibration circuit 200A in accordance with some embodiments. The calibration circuit 200A is configured to calibrate a device to be calibrated 210. In one or more embodiments, the device to be calibrated 210 is one of the pull-up resistor Rp, the pull-down resistor Rn, the first termination resistor R1 or the second termination resistor R2. The calibration circuit 200A includes a device under test 220 which is a copy of at least one portion of the device to be calibrated 210. The calibration circuit 200A further includes a variable current source 230, a reference voltage decoder 240, a comparator 250, a calibration controller 260, and a reference voltage generator 270.

The device under test 220 and the variable current source 230 are coupled in series between the first supply voltage terminal of the power supply voltage VDD and the second supply voltage terminal of the ground voltage VSS. A node 280 between the device under test 220 and the variable current source 230 is coupled to a first input 251 of the comparator 250. The comparator 250 further includes a second input 252 coupled to the reference voltage generator 270 to receive a reference voltage Vref therefrom. The reference voltage generator 270 is further coupled to an input 241 of the reference voltage decoder 240 to supply the reference voltage Vref to the reference voltage decoder 240. The reference voltage decoder 240 has an output 242 coupled to the variable current source 230 to control a variable current Iv generated by the variable current source 230 based on the reference voltage Vref. As a result, a voltage Vcom at the node 280 and derived from the resistance R of the device under test 220 and the variable current Iv is controlled based on the reference voltage Vref. The voltage Vcom is determined as follows: Vcom=VDD−Iv×R.

The comparator 250 compares the voltage Vcom at the first input 251 with the reference voltage Vref at the second input 252 and outputs a comparison result at an output 253 of the comparator 250. An input 261 of the calibration controller 260 is coupled to the output 253 of the comparator 250 to receive the comparison result therefrom. The calibration controller 260 generates at least one calibration signal at an output 262 thereof based on the comparison result. The calibration signal is supplied to the device to be calibrated 210 and the device under test 220 to adjust an adjustable electrical parameter of the device to be calibrated 210 and the device under test 220. In one or more embodiments, the adjustable electrical parameter is the resistance of the device to be calibrated 210 and device under test 220. In one or more embodiments, the calibration signal comprises the switching signals S(m) for switching ON or OFF the MOS transistors in the device to be calibrated 210 and its copy in the device under test 220.

In one or more embodiments, if Vcom<Vref, the comparison result, e.g., a negative signal, indicates that the resistance of the device to be calibrated 210 and the device under test 220 has not reached a target value, i.e., impedance matching has not been reached. The calibration controller 260, based on the comparison result represented by the negative signal, generates a calibration signal that increases the resistance of the device under test 220 and the device to be calibrated 210. For example, the resistance of the device under test 220 or the device to be calibrated 210 is increased by switching OFF one or more of the MOS transistors in the corresponding resistor array. The increased resistance R of the device under test 220 increases the voltage Vcom which is again compared with the reference voltage Vref. If the comparison result still indicates that Vcom<Vref, the resistance of the device to be calibrated 210 and device under test 220 is again increased, and the calibration process is repeated until a substantially zero signal occurs at the output 253 of the comparator 250, indicating that voltage Vcom has reached reference voltage Vref. In some embodiments, the output signal of the comparator 250 is considered a substantially zero signal when the output signal has a voltage level within a predetermined tolerance around the ground voltage, for example, ±5 mV. The substantially zero signal at the output 253 of the comparator 250 is determined by the calibration controller 260 that impedance matching has been reached, and the calibration controller 260 maintains the calibration signal at the output 262 thereof. As a result, the resistance of the device to be calibrated 210 and device under test 220 is maintained at the target value that achieves impedance matching.

If Vcom>Vref, the comparison result, e.g., a positive signal, indicates that the resistance of the device to be calibrated 210 and the device under test 220 has exceeded the target value, i.e., impedance matching has not been reached. The calibration controller 260, based on the comparison result represented by the positive signal, generates a calibration signal that decreases the resistance of the device under test 220 and the device to be calibrated 210. For example, the resistance of the device under test 220 or the device to be calibrated 210 is decreased by switching ON one or more of the MOS transistors in the corresponding resistor array. The decreased resistance R of the device under test 220 decreases the voltage Vcom which is again compared with the reference voltage Vref. If the comparison result still indicates that Vcom>Vref, the resistance of the device to be calibrated 210 and device under test 220 is again decreased, and the calibration process is repeated until a substantially zero signal occurs at the output 253 of the comparator 250, indicating that voltage Vcom has reached reference voltage Vref. The substantially zero signal at the output 253 of the comparator 250 is determined by the calibration controller 260 that impedance matching has been reached, and the calibration controller 260 maintains the calibration signal at the output 262 thereof. As a result, the resistance of the device to be calibrated 210 and device under test 220 is maintained at the target value that achieves impedance matching.

In some embodiments, the calibration circuit 200A dynamically adjusts the resistance of the device to be calibrated 210 to achieve impedance matching, thereby compensating for numerous variations in manufacturing process, operating voltage, operating temperature, etc. Particularly, compensation for voltage variation is achieved by controlling the variable current Iv, and therefore the voltage Vcom, based on variations of the reference voltage Vref. In one or more embodiments, Vref=VDD/2, and impedance matching is achieved when $$V\text{com}=V\text{ref, or;}$$

$$VDD-Iv \times R=VDD/2, \text{ or;}$$

$$VDD/2=Iv \times R.$$

As VDD fluctuates, Vref=VDD/2 also varies. However, Iv is automatically controlled based on Vref which is proportional to VDD. In other words, Iv is controlled based on VDD to compensate for variations of VDD. Therefore, the resistance R is calibrated to achieve VDD/2=Iv×R with higher accuracy than when Iv is a constant current or is not controlled based on VDD. In one or more embodiments, the variable current Iv is increased in response to an increase of the reference voltage Vref or VDD, and the variable current Iv is decreased in response to a decrease of the reference voltage Vref or VDD.

Figure 2B:
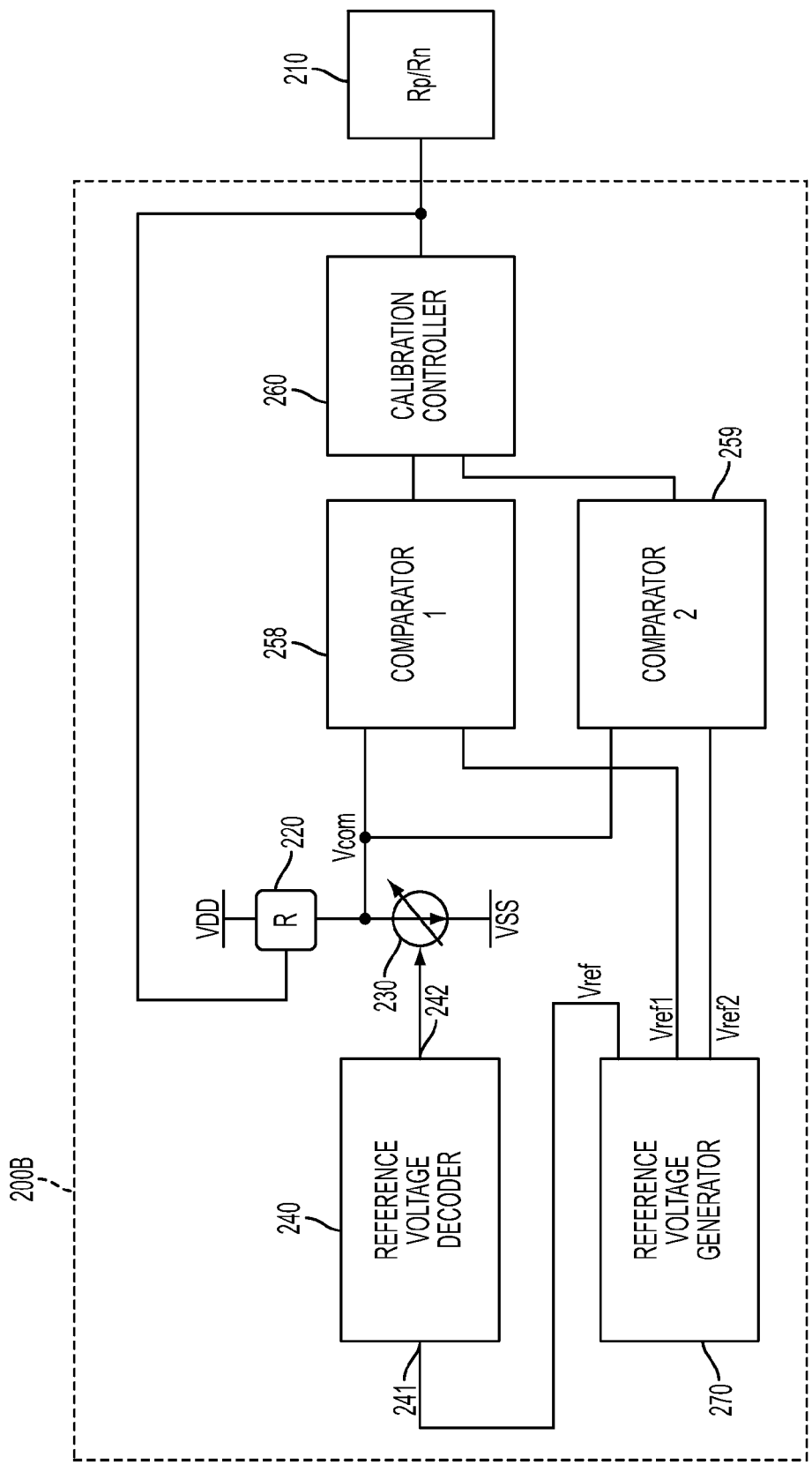

FIG. 2B is a schematic circuit diagram of a calibration circuit 200B in accordance with some embodiments. In the calibration circuit 200B, impedance matching is determined to be achieved when the resistance of the device to be calibrated 210 and device under test 220 falls within a predetermined range. The calibration circuit 200B includes two comparators 258, 259 for comparing the voltage Vcom with corresponding two different additional reference voltages Vref1, Vref2 representing the corresponding upper limit and lower limit of the predetermined range. The additional reference voltages Vref1, Vref2 are generated by the reference voltage generator 270, so that Vref1=Vref+x %×Vref, and Vref2=Vref−x %×Vref. The value of "x" depends on a particular application. For example, in one or more embodiments, x=5. In one or more embodiments for more precise impedance matching, x=1. Other values of "x" are within the scope of various embodiments.

The calibration controller 260 receives comparison results from the two comparators 258, 259 and adjusts the resistance of the device to be calibrated 210 and the device under test 220 until the resistance fails within the predetermined range. For example, if the comparison result of the comparator 258 indicates that Vcom>Vref1, i.e., the resistance of the device to be calibrated 210 and the device under test 220 has exceeded the upper limit of the predetermined range, the calibration controller 260 generates a calibration signal that decreases the resistance of the device under test 220 and the device to be calibrated 210 until the comparison result of the comparator 258 indicates that Vcom≤Vref1. If the comparison result of the comparator 259 indicates that Vcom<Vref2, i.e., the resistance of the device to be calibrated 210 and the device under test 220 has not reached the lower limit of the predetermined range, the calibration controller 260 generates a calibration signal that increases the resistance of the device under test 220 and the device to be calibrated 210 until the comparison result of the comparator 259 indicates that Vcom≥Vref2. If the comparison results of the comparators 258, 259 indicate that Vref2≤Vcom≤Vref1, the calibration controller 260 maintains the calibration signal. One or more effects obtainable in the calibration circuit 200A are also achieved in the calibration circuit 200B.

Figure 3:
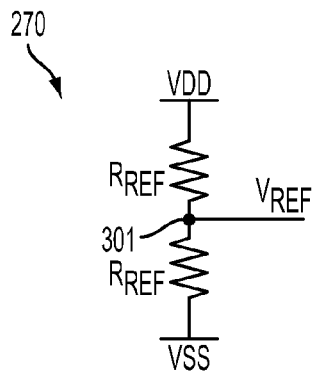
FIGS. 3-5 are schematic circuit diagrams of various components of the calibration circuit in accordance with some embodiments.

FIG. 3 is a schematic circuit diagram of the reference voltage generator 270 of the calibration circuit 200A or 200B in accordance with some embodiments. The reference voltage generator 270 includes a voltage divider having two identically or similarly configured reference resistors Rref coupled in series between the first supply voltage terminal of VDD and the second supply voltage terminal of VSS. The reference voltage Vref=VDD/2 is generated at a node 301 between the reference resistors Rref. The reference voltage Vref is supplied from the node 301 to the input 241 of the reference voltage decoder 240 and the second input 252 of the comparator 250. The additional reference voltages Vref1, Vref2 in the calibration circuit 200B are generated, in some embodiments, by other, similarly constructed voltage dividers in the reference voltage generator 270. Other arrangements for generating the reference voltage Vref and/or values of Vref other than VDD/2 are within the scope of various embodiments.

Figure 4:
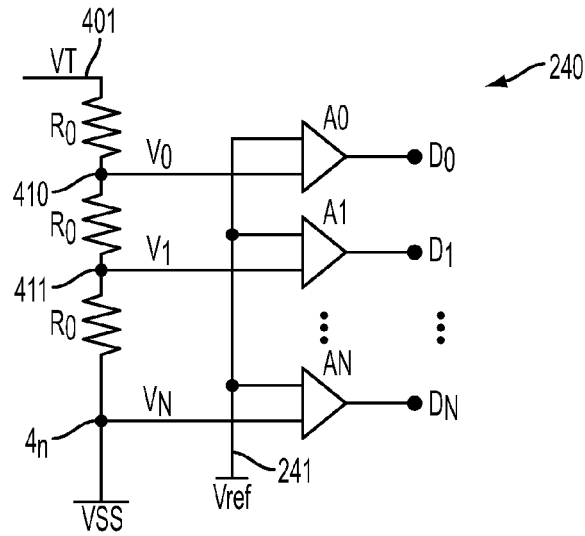

FIG. 4 is a schematic circuit diagram of the reference voltage decoder 240 of the calibration circuit 200A or 200B in accordance with some embodiments. The reference voltage decoder 240 includes a voltage divider 401 and a plurality of comparators A0, A1, ... An. The voltage divider 401 includes a plurality of resistors Ro coupled in series between a predetermined supply voltage terminal of VT and the second supply voltage terminal of VSS. The resistors Ro are similarly or identically configured to define a plurality of predetermined voltages V0, V1, ... Vn at corresponding nodes 410, 411, ... 41n between the resistors Ro. The plurality of predetermined voltages are arranged in descending order, i.e., V0>V1> ... >Vn. The predetermined power supply voltage VT is provided by a bandgap reference voltage circuit and is a steady voltage not substantially affected by variations in the power supply voltage VDD. As a result, the plurality of predetermined voltages V0, V1, . . . Vn are also steady voltages not substantially affected by variations in the power supply voltage VDD. In one or more embodiments, the predetermined power supply voltage VT is greater than about 70% of a nominal value of VDD.

Each of the comparators A0, A1, . . . An has a first input coupled to receive the reference voltage Vref from the reference voltage generator 270 via the input 241, and a second input coupled to the corresponding nodes 410, 411, . . . 41n to receive the corresponding predetermined voltages V0, V1, . . . Vn. The comparators A0, A1, . . . An compare the reference voltage Vref with the predetermined voltages V0, V1, . . . Vn and output corresponding current control signals D0, D1, . . . Dn which are referred to herein as current control signals D(n). The current control signal Di (i=0 . . . n) is zero (or logic LOW) when Vi≥Vref, and is 1 (or logic HIGH) when Vi<Vref. For example, when Vref is between V0 and V1, i.e., V0>Vref>V1> . . . >Vn, the current control signals D1, D2, . . . Dn are at logic HIGH and the current control signal D0 is at logic LOW. In one or more embodiments, n=0, i.e., the reference voltage decoder 240 includes one comparator A0 for generating a current control signal D0 at logic LOW when V0≥Vref, and at logic HIGH when V0<Vref. The outputs of the comparators A0, A1, . . . An together define the output 242 of the reference voltage decoder 240. Other arrangements, i.e., both digital and analog arrangements, of the reference voltage decoder are within the scope of various embodiments.

Figure 5:
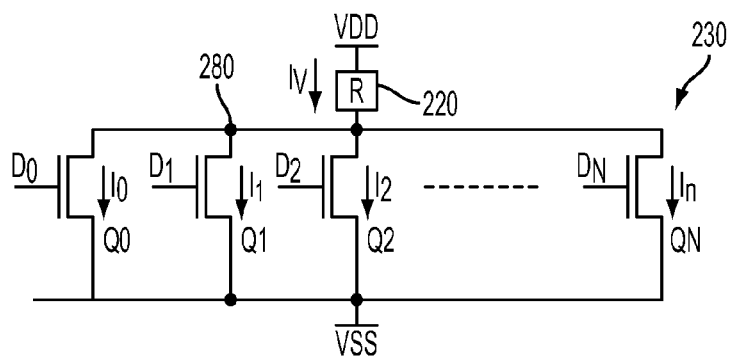

FIG. 5 is a schematic circuit diagram of the variable current source 230 of the calibration circuit 200A or 200B in accordance with some embodiments. The variable current source 230 includes a plurality of current sources Q0, Q1, . . . Qn. The current sources Q0, Q1, . . . Qn each have control terminals coupled to the output 242 of the reference voltage decoder 240 to receive corresponding current control signals D0, D1, . . . Dn. One or more of the current sources Q0, Q1, . . . Qn is turned ON or OFF according to the corresponding current control signals D0, D1, . . . Dn. One or more currents I0, I1, . . . In flowing through the corresponding current sources Q0, Q1, . . . Qn, when the corresponding current sources are turned ON, together generate the variable current Iv of the variable current source 230. By variously switching ON or OFF one or more of the current sources Q0, Q1, . . . Qn by the current control signals D0, D1, . . . Dn generated based on the reference voltage Vref, the variable current Iv is also controlled to vary based on the reference voltage Vref.

Thus, in the given example, for example, when Vref is between V0 and V1, i.e., V0>Vref>V1> . . . >Vn, the current control signals D1, D2, . . . Dn are at logic HIGH and the current control signal D0 is at logic LOW. As a result, the current sources Q1, . . . Qn are turned ON, and the current source Q0 is turned OFF. Thus, in the given example, the variable current Iv is a sum of the currents I1, . . . In. If Vref increases, e.g., due to a fluctuation in the power supply voltage VDD, to exceed V0, the current control signal D0 is switched to logic HIGH and turns ON the corresponding current source Q0. As a result, the current I0 is added to the variable current Iv which is increased in response to the increase in Vref. If Vref decreases to be between V1 and V2, the current control signal D1 is switched to logic LOW and turns OFF the corresponding current source Q1. As a result, the current I1 is removed from the variable current Iv which is decreased in response to the decrease in Vref.

In one or more embodiments, the variable current source 230 comprises an array of MOS transistors, such as PMOS or NMOS transistors. The device to be calibrated 210 and the device under test 220 also each include an array of MOS transistors, such as PMOS or NMOS transistors. The MOS transistor array of the variable current source 230 is different from the MOS transistor array of the device to be calibrated 210 or the device under test 220 in that the MOS transistors in the variable current source 230 are not configured to exhibit a specific resistance. In one or more embodiments, to reduce current mirror mismatch, the MOS transistors in the variable current source 230 are made to have a larger size than the MOS transistors in the resistor array of the device to be calibrated 210 and the device under test 220. For example, the size of each MOS transistor in the variable current source 230 is about 1.5-2 times the size of each MOS transistor in the resistor array of the device to be calibrated 210 and the device under test 220. The smaller MOS transistors of the variable current source 230, due to their small sizes, provide high speed adjustment of the variable current Iv in response to fluctuations in the power supply voltage VDD, and occupy a small die area. Thus, a high speed, low power consumption, and compact calibration circuit is obtainable in comparison to calibration circuits where off-chip reference resistors are used.

Figure 6:
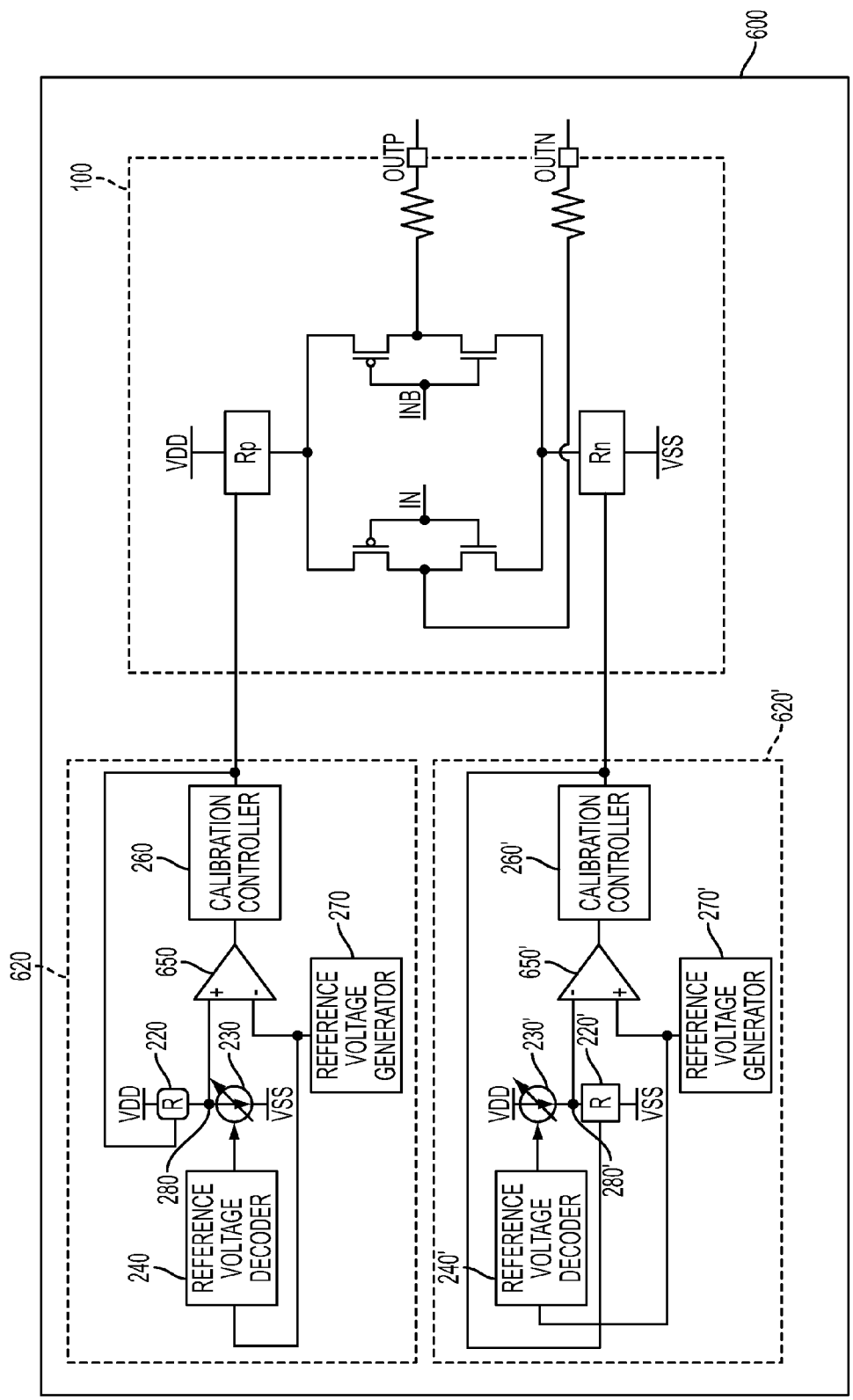
FIGS. 6-8 are schematic circuit diagrams of various integrated circuits having calibration circuits in accordance with some embodiments.

FIG. 6 is a schematic circuit diagram of an integrated circuit 600 in accordance with some embodiments. The integrated circuit 600 includes the voltage mode driver 100, a calibration circuit 620 and another calibration circuit 620'. The voltage mode driver 100 includes the pull-up resistor Rp as a device to be calibrated by the calibration circuit 620, and the pull-down resistor Rn as a device to be calibrated by the calibration circuit 620'. The calibration circuits 620 and 620' are configured on chip with the voltage mode driver 100, including the devices to be calibrated, i.e., the pull-up resistor Rp and the pull-down resistor Rn.

The calibration circuit 620, similar to the calibration circuit 200A, includes the variable current source 230, the reference voltage decoder 240, the calibration controller 260 and the reference voltage generator 270. The calibration circuit 620 includes the device under test 220 which is a copy of at least one portion of the pull-up resistor Rp to be calibrated by the calibration circuit 620. The comparator 250 in the calibration circuit 200A is realized in the calibration circuit 620 by an operational amplifier 650 which has a positive (or non-inverting) input coupled to the node 280, and a negative (or inverting) input coupled to receive the reference voltage Vref from the reference voltage generator 270. The calibration circuit 620 operates in a manner similar to that described with respect to the calibration circuit 200A.

The calibration circuit 620' is similar to the calibration circuit 620, and includes a variable current source 230', a reference voltage decoder 240', a calibration controller 260', a reference voltage generator 270', and an operational amplifier 650' each corresponding in turn to the variable current source 230, the reference voltage decoder 240, the calibration controller 260, the reference voltage generator 270, and the operational amplifier 650 of the calibration circuit 620. The calibration circuit 620' further includes a device under test 220' which is a copy of at least one portion of the pull-down resistor Rn to be calibrated by the calibration circuit 620'. The operational amplifier 650' has a negative (or inverting) input coupled to a node 280' between the device under test 220' and the variable current source 230', and a positive (or non-inverting) input coupled to receive the reference voltage Vref from the reference voltage generator 270. The calibration circuit 620' operates in a manner similar to that described with respect to the calibration circuit 200A.

In some embodiments, the integrated circuit 600 further includes a receiver similar to the receiver 120 described with respect to FIG. 1, for terminating a communication link with a transmitter of another integrated circuit. The receiver includes termination resistors similar to the first termination resistor R1 and the second termination resistor R2 of the receiver 120. In one or more embodiments, one or more of the termination resistors in the receiver of the integrated circuit 600 is calibrated by a calibration circuit similar to the calibration circuit 620 or the calibration circuit 620'. Other arrangements implementing the calibration circuit 200B of FIG. 2B are within the scope of various embodiments.

Figure 7:
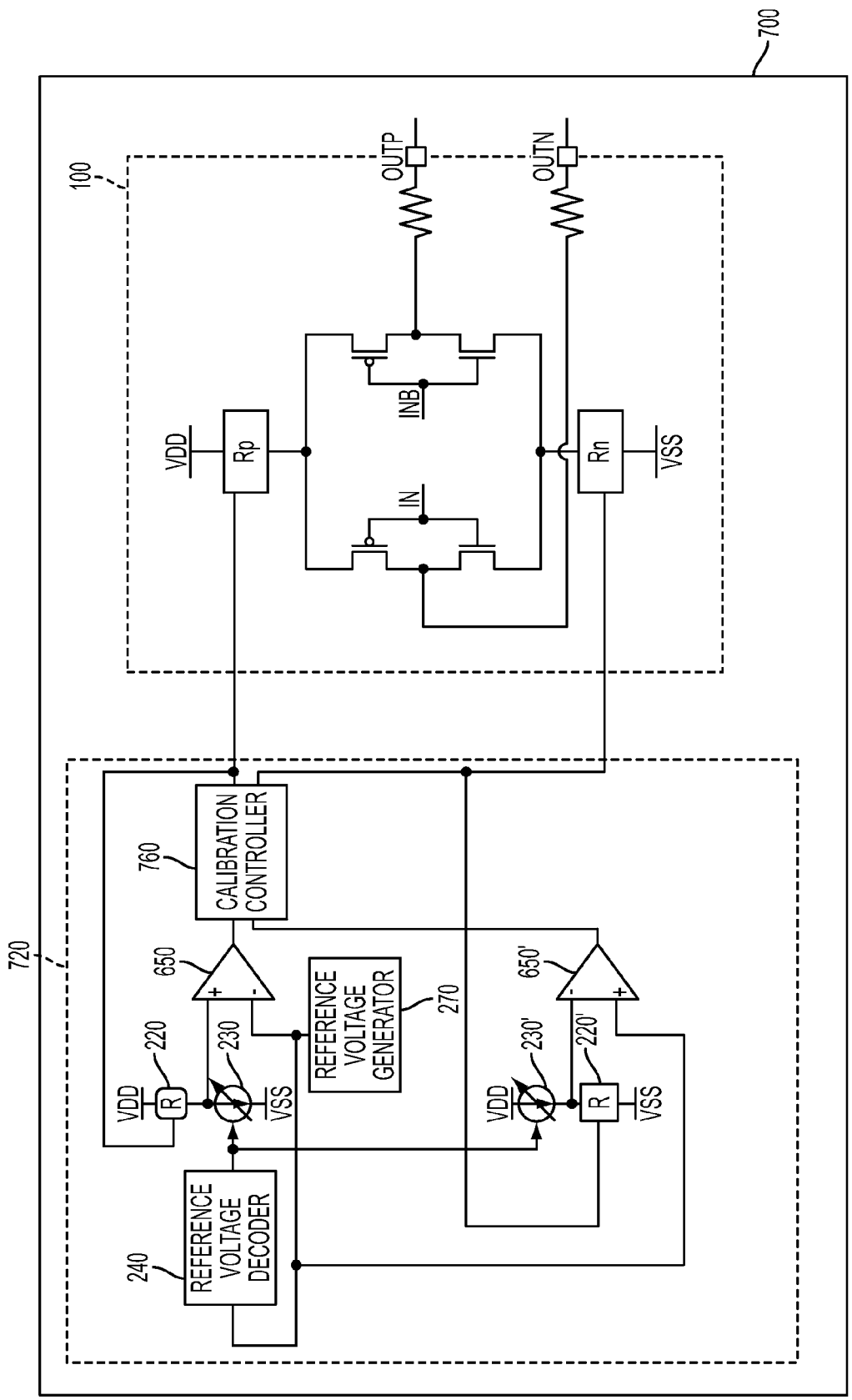

FIG. 7 is a schematic circuit diagram of an integrated circuit 700 in accordance with some embodiments. The integrated circuit 700 includes the voltage mode driver 100 and a calibration circuit 720. The voltage mode driver 100 includes the pull-up resistor Rp and the pull-down resistor Rn as devices to be calibrated by the calibration circuit 720. The calibration circuit 720 is configured on chip with the voltage mode driver 100, including the devices to be calibrated, i.e., the pull-up resistor Rp and the pull-down resistor Rn.

The calibration circuit 720 is a combined circuit of the calibration circuit 620 and the calibration circuit 620'. In the calibration circuit 720, a single reference voltage decoder 240 and a single reference voltage generator 270 are used in common for calibrating both the pull-up resistor Rp and the pull-down resistor Rn, whereas a common calibration controller 760, which is a combined circuit of the calibration controller 260 and the calibration controller 260', is configured for calibrating both the pull-up resistor Rp and the pull-down resistor Rn. Other components of the calibration circuit 720 are similar to those described with respect to the calibration circuit 620 and the calibration circuit 620'. The calibration circuit 720 operates in a manner similar to that described with respect to the calibration circuit 620 and the calibration circuit 620'. Other arrangements implementing the calibration circuit 200B of FIG. 2B are within the scope of various embodiments.

In some embodiments, by configuring the calibration circuit on chip with the device to be calibrated, i.e., both the calibration circuit and the device to be calibrated are integrated in the same integrated circuit, one or more benefits are obtainable. For example, the calibration circuit is configured on-chip, without connection to or from off-chip components, such as a large off-chip reference resistor. Thus, the overall size and manufacturing cost of the integrated circuit are reducible. The calibration circuit in accordance with some embodiments provides a high speed, low power consumption, small die area solution at the chip level in comparison to calibration circuits where off-chip reference resistors are used. The calibration result is accurate, because voltage variations due to fluctuations in the power supply voltage are compensated for by the variable current source which varies the current used for calibration based on the fluctuations in the power supply voltage. Other variations, such as process and temperature variations, are also compensated for in one or more embodiments. Particularly, the calibration circuit is made on-chip with the device to be calibrated by the same or similar technology and process, e.g., MOS technology and process. Thus, process variations, if present, are similarly applied across both the calibration circuit and the device to be calibrated, without significantly affecting the calibration result in operation. Likewise, variations in operating temperature are also applied across both the calibration circuit and the device to be calibrated, without significantly affecting the calibration result in operation. In one or more embodiments, the described calibration circuit and/or integrated circuit is applicable to USB and/or PCI Express applications. Other applications of the described calibration circuit and/or integrated circuit are within the scope of various embodiments.

Figure 8:
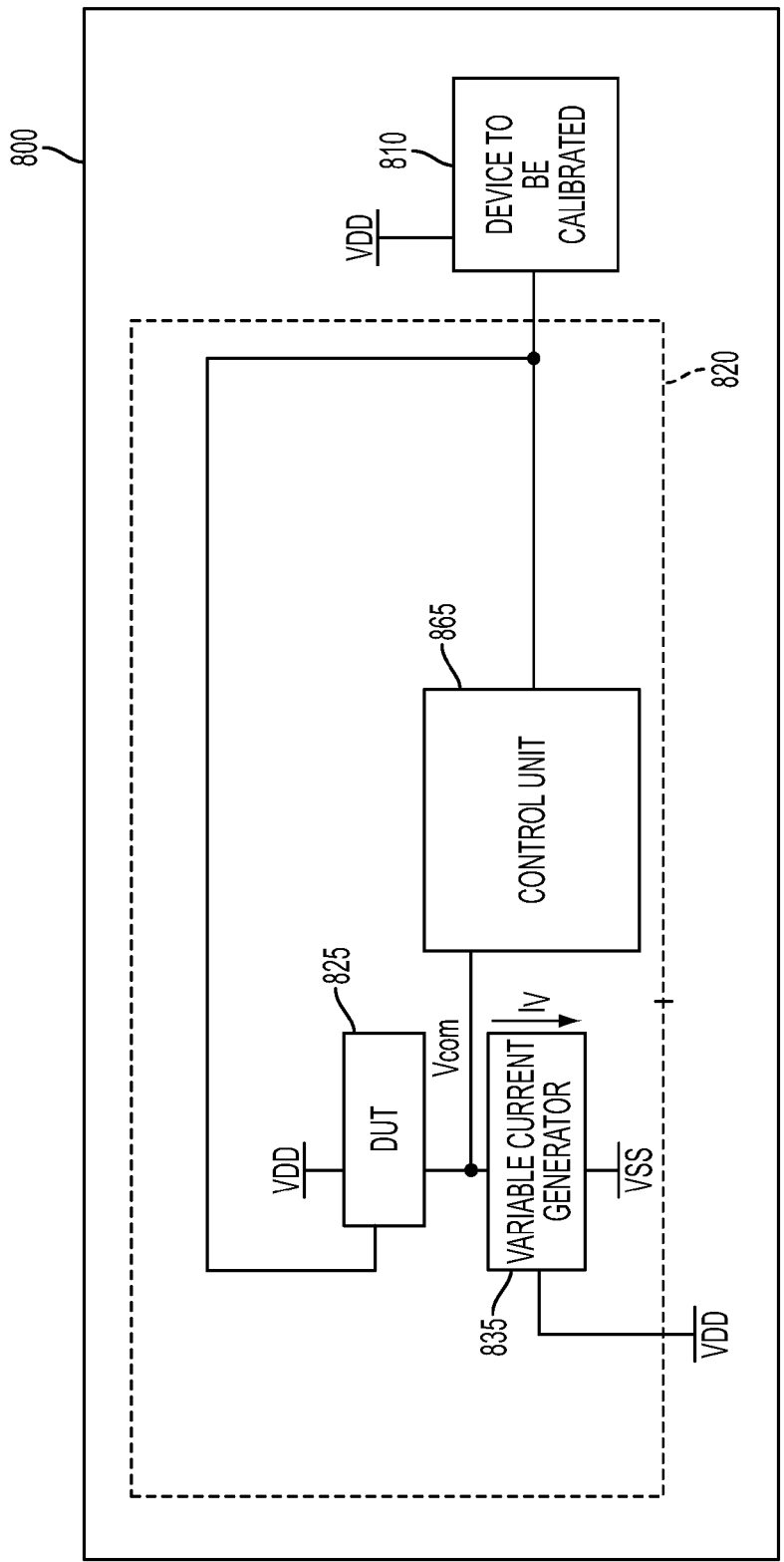

FIG. 8 is a schematic circuit diagram of an integrated circuit 800 in accordance with some embodiments. The integrated circuit 800 includes a device to be calibrated 810, and a calibration circuit 820 which is configured on chip with the device to be calibrated 810. The calibration circuit 820 includes a device under test 825 which is a copy of at least one portion of the device to be calibrated 810. The calibration circuit 820 also includes a variable current generator 835 for generating a variable current Iv responsive to variations of a power supply voltage VDD supplied to the device to be calibrated 810. A voltage Vcom is derived from the device under test 825 and the variable current Iv. The calibration circuit 820 further includes a control unit 865 coupled to the device to be calibrated 810 and the device under test 825, and configured to generate, in response to the voltage Vcom, at least one calibration signal for adjusting an adjustable electrical parameter of the device under test 825 and the device to be calibrated 810.

In some embodiments, the device to be calibrated 810 and the device under test 825 each include an adjustable or variable resistor array as described with respect to FIGS. 2-7. However, circuits other than resistors or resistor arrays are usable as the device to be calibrated 810 and the device under test 825 in various embodiments.

In some embodiments, the variable current generator 835 includes a variable current source and a reference voltage decoder, and adjusts the variable current Iv based on a reference voltage Vref, as described with respect to FIGS. 2-7. However, other arrangements for controlling the variable current Iv based on variations of the power supply voltage are within the scope of various embodiments.

In some embodiments, the control unit 865 includes a comparator for comparing the voltage Vcom with the reference voltage Vref, and a calibration controller for generating at least one calibration signal based on the comparison, as described with respect to FIGS. 2-7. However, other arrangements for generating at least one calibration signal based on the voltage Vcom are within the scope of various embodiments.

Figure 9:
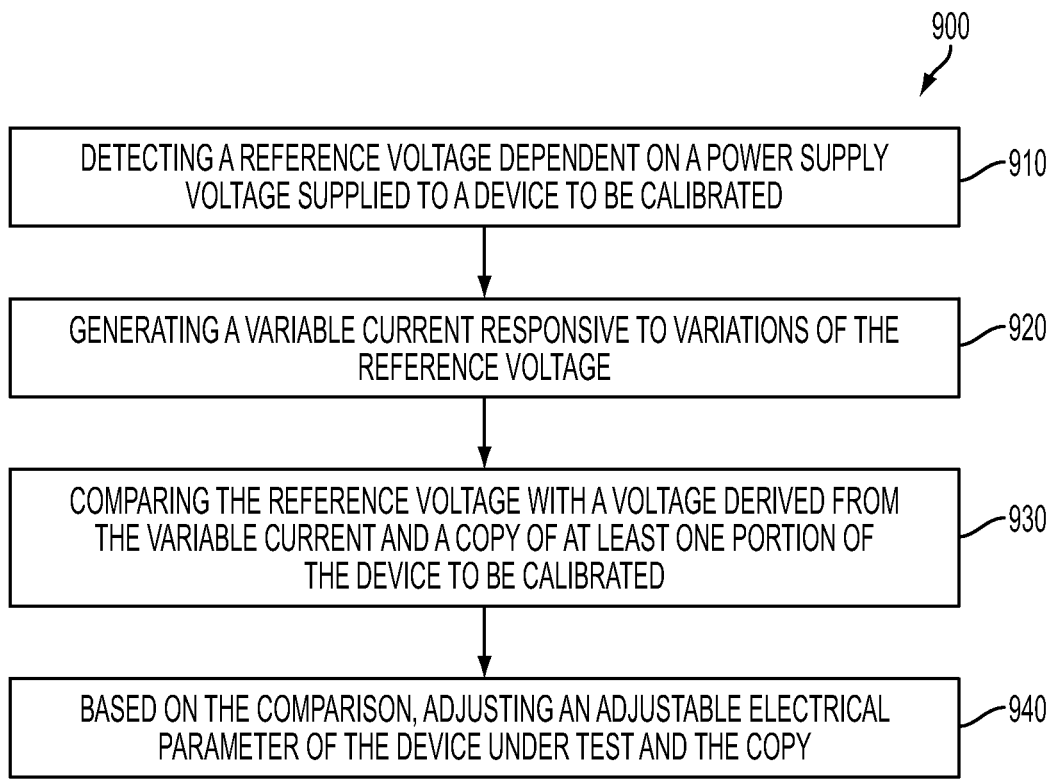
FIG. 9 is a flow chart of a calibration method in accordance with some embodiments.

FIG. 9 is a flow chart of a calibration method 900 in accordance with some embodiments. The method 900 is performed by a calibration circuit and/or an integrated circuit in accordance with the embodiments described herein.

At operation 910, a reference voltage dependent on a power supply voltage supplied to a device to be calibrated is detected. For example, the reference voltage Vref dependent on the power supply voltage VDD supplied to a device to be calibrated 210 is detected by the reference voltage decoder 240, as described with respect to FIG. 2A and/or FIG. 2B.

At operation 920, a variable current is generated in response to variation of the reference voltage. For example, the variable current Iv is generated, by the variable current source 230, in response to variation of the reference voltage Vref, as described with respect to FIG. 2A and/or FIG. 2B.

At operation 930, the reference voltage is compared with a voltage derived from the variable current and a copy of at least one portion of the device to be calibrated. For example, the reference voltage Vref is compared with a voltage Vcom derived from the variable current Iv and a copy of at least one portion of the device to be calibrated in the device under test 220, as described with respect to FIG. 2A and/or FIG. 2B.

At operation 940, based on the comparison, an adjustable electrical parameter of the device under test and the copy is adjusted. For example, based on the comparison, the adjustable resistance of the device under test 210 and the device under test 220 is adjusted, as described with respect to FIG. 2A and/or FIG. 2B.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a calibration circuit for calibrating a device to be calibrated comprises a variable current generator, a device under test and a control unit. The variable current generator is coupled to a first node of a reference voltage and configured to generate a variable current responsive to variations of the reference voltage. The device under test is a copy of at least one portion of the device to be calibrated, and coupled to the variable current generator to derive, at a second node, a voltage dependent on the variable current. The control unit is coupled to the second node to receive the derived voltage and configured to compare the derived voltage with the reference voltage and to generate, based on a comparison result, at least one calibration signal for adjusting an adjustable electrical parameter of the device under test and the device to be calibrated.

According to some embodiments, an integrated circuit comprises a device to be calibrated, and a calibration circuit configured on-chip with the device to be calibrated for calibrating the device to be calibrated. The calibration circuit comprises a variable current generator, a device under test and a control unit. The variable current generator is configured to generate a variable current responsive to variations of a power supply voltage supplied to the device to be calibrated. The device under test is a copy of at least one portion of the device to be calibrated, and coupled to the variable current generator to derive a voltage dependent on the variable current. The control unit is coupled to the device to be calibrated and the device under test, and configured to generate, in response to the voltage derived from the variable current and the device under test, at least one calibration signal for adjusting an adjustable electrical parameter of the device under test and the device to be calibrated.

According to some embodiments, a method of calibrating a device to be calibrated comprises detecting a reference voltage dependent on a power supply voltage supplied to the device to be calibrated. A variable current responsive to variations of the reference voltage is generated. The reference voltage is compared with a voltage derived from the variable current and a copy of at least one portion of the device to be calibrated. Based on the comparison, an adjustable electrical parameter of the device under test and the copy is adjusted.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A calibration circuit for calibrating a device to be calibrated, comprising:
   a variable current generator coupled to a first node having a reference voltage the variable current generator configured to receive the reference voltage and generate a variable current responsive to variations of the reference voltage;
   a device under test which is a copy of at least one portion of the device to be calibrated, the device under test coupled to the variable current generator to derive, at a second node, a voltage dependent on the variable current; and
   a control unit coupled to the second node to receive the derived voltage and configured to compare the derived voltage with the reference voltage and to generate, based on a comparison result, at least one calibration signal for adjusting an adjustable electrical parameter of the device under test and the device to be calibrated.

2. The calibration circuit of claim 1, wherein the variable current generator comprises:
   a reference voltage decoder configured to generate at least one current control signal responsive to a voltage level of the reference voltage; and
   a variable current source coupled to the reference voltage decoder and configured to generate the variable current responsive to the at least one current control signal.

3. The calibration circuit of claim 2, wherein the reference voltage decoder comprises at least one comparator configured to generate the at least one current control signal in response to a comparison of the reference voltage with at least one predetermined voltage.

4. The calibration circuit of claim 2, wherein
   the reference voltage decoder comprises a plurality of comparators configured to generate a plurality of current control signals in response to comparison of the reference voltage with a plurality of predetermined voltages; and
   the variable current source comprises a plurality of current sources each controllable by a corresponding one of the current control signals.

5. The calibration circuit of claim 1, wherein the device under test includes a resistor array of a plurality of resistors at least one of which is controllable by the at least one calibration signal for adjusting a resistance of the resistor array.

6. The calibration circuit of claim 5, wherein the control unit comprises:
   a comparator configured to compare the reference voltage with the voltage derived from the resistance of the resistor array and the variable current; and
   a calibration controller coupled to the comparator and configured to generate the at least one calibration signal in response to the comparison.

7. The calibration circuit of claim 1, wherein the variable current generator is configured to increase the variable current in response to an increase of the reference voltage, and to decrease the variable current in response to a decrease of the reference voltage.

8. An integrated circuit, comprising:
   a device to be calibrated; and
   a calibration circuit configured on-chip with the device to be calibrated for calibrating the device to be calibrated, wherein the calibration circuit comprises:
   a variable current generator configured to receive a reference voltage and generate a variable current responsive to variations of the reference voltage, the reference voltage being generated based on a power supply voltage supplied to the device to be calibrated;
   a device under test which is a copy of at least one portion of the device to be calibrated, the device under test coupled to the variable current generator to derive a voltage dependent on the variable current; and a control unit coupled to the device to be calibrated and the device under test, and configured to generate, in response to the voltage derived from the variable current and the device under test, at least one calibration signal for adjusting an adjustable electrical parameter of the device under test and the device to be calibrated.

9. The integrated circuit of claim 8, wherein the device to be calibrated is a voltage mode driver, and the adjustable electrical parameter of the voltage mode driver is a resistance thereof.

10. The integrated circuit of claim 8, wherein
the device to be calibrated includes a first resistor array of a plurality of resistors, and at least one of the resistors of the first resistor array is controllable by the at least one calibration signal to adjust a resistance of the first resistor array; and
the device under test includes a second resistor array of a plurality of resistors, and at least one of the resistors of the second resistor array is controllable by the at least one calibration signal to adjust a resistance of the second resistor array.

11. The integrated circuit of claim 10, wherein the resistors comprise metal-oxide semiconductor (MOS) transistors.

12. The integrated circuit of claim 10, wherein the variable current generator comprises:
a reference voltage decoder configured to generate at least one current control signal responsive to a voltage level of the reference voltage dependent on the power supply voltage; and
a variable current source coupled to the reference voltage decoder and configured to generate the variable current responsive to the at least one current control signal.

13. The integrated circuit of claim 12, wherein
the reference voltage decoder comprises a plurality of comparators configured to generate a plurality of current control signals in response to comparisons of the reference voltage with a plurality of predetermined voltages; and
the variable current source comprises a plurality of current sources each controllable by one of the current control signals.

14. The integrated circuit of claim 13, wherein the reference voltage decoder comprises a voltage divider having a plurality of output terminals each for outputting one of the predetermined voltages.

15. The integrated circuit of claim 13, wherein the current sources comprise metal-oxide semiconductor (MOS) transistors coupled in parallel.

16. The integrated circuit of claim 15, wherein the control unit comprises:
a comparator configured to compare the reference voltage with the voltage derived from the variable current; and
a calibration controller coupled to the comparator and configured to generate the at least one calibration signal in response to the comparison.

17. The integrated circuit of claim 15, wherein the control unit comprises:
a first comparator configured to compare a first additional reference voltage with the voltage derived from the variable current, the first additional reference voltage dependent on and higher than the reference voltage;
a second comparator configured to compare a second additional reference voltage with the voltage derived from the variable current, the second additional reference voltage dependent on and lower than the reference voltage; and
a calibration controller coupled to the first comparator and the second comparator, and configured to generate the at least one calibration signal in response to comparison results outputted by the first comparator and the second comparator.

18. The integrated circuit of claim 8, wherein
the control unit is configured to generate the at least one calibration signal further in response to another voltage derived from another variable current;
the device to be calibrated comprises a voltage mode driver having
a pull-up circuit with an adjustable pull-up resistor, and
a pull-down circuit with an adjustable pull-down resistor;
the device under test comprises
a first copy of at least one portion of the adjustable pull-up resistor, and
a second copy of at least one portion of the adjustable pull-down resistor; and
the variable current generator comprises
a first variable current source coupled to the first copy and configured to generate the variable current, and
a second variable current source coupled to the second copy and configured to generate the another variable current.

19. The integrated circuit of claim 18, wherein
the variable current generator comprises a reference voltage decoder configured to generate at least one current control signal responsive to a level of a reference voltage dependent on the power supply voltage;
each of the first and second variable current sources is coupled to the reference voltage decoder and configured to generate the variable current and the another variable current responsive to the at least one current control signal; and
the control unit comprises:
a first comparator configured to compare the reference voltage with the voltage derived from the variable current,
a second comparator configured to compare the reference voltage with another voltage derived from the another variable current, and
a calibration controller coupled to the first comparator and the second comparator and configured to generate, in response to the comparisons, a first calibration signal for adjusting the resistances of the first copy and the pull-up resistor and a second calibration signal for adjusting the resistances of the second copy and the pull-down resistor.

20. A method of calibrating a device to be calibrated, the method comprising:
detecting a reference voltage dependent on a power supply voltage supplied to the device to be calibrated;
a variable current generator receiving the reference voltage and generating a variable current responsive to variations of the reference voltage;
comparing the reference voltage with a voltage derived from the variable current and a copy of at least one portion of the device to be calibrated; and based on the comparison, adjusting an adjustable electrical parameter of the device to be calibrated and the copy.

* * * * *